United States Patent
Yang et al.

(10) Patent No.: US 9,577,617 B2
(45) Date of Patent: Feb. 21, 2017

(54) LEVEL CONVERSION CIRCUIT AND APPARATUS

(71) Applicant: Huawei Technologies Co., Ltd., Shenzhen, Guangdong (CN)

(72) Inventors: Jinda Yang, Shanghai (CN); Liren Zhou, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/167,127

(22) Filed: May 27, 2016

(65) Prior Publication Data

US 2016/0352312 A1    Dec. 1, 2016

(30) Foreign Application Priority Data

May 29, 2015   (CN) .......................... 2015 1 0287692

(51) Int. Cl.
  *H03L 5/00* (2006.01)
  *H03K 3/356* (2006.01)
  *H03K 19/0185* (2006.01)
  *H03K 3/012* (2006.01)

(52) U.S. Cl.
  CPC ........ *H03K 3/356104* (2013.01); *H03K 3/012* (2013.01); *H03K 19/018521* (2013.01)

(58) Field of Classification Search
  CPC .............. H03K 3/356104; H03K 3/012; H03K 19/018521
  See application file for complete search history.

(56) References Cited

U.S. PATENT DOCUMENTS

| | | | |
|---|---|---|---|
| 6,351,138 B1 * | 2/2002 | Wong | H04L 25/0298 326/30 |
| 6,686,899 B2 * | 2/2004 | Miyazawa | G09G 3/3648 326/81 |
| 6,714,046 B2 * | 3/2004 | Fujikawa | H03K 19/01857 326/62 |

* cited by examiner

*Primary Examiner* — Kenneth B Wells

(57) ABSTRACT

The present invention provides a level conversion circuit. The circuit is as follows: A cathode of a first equivalent diode is connected to a reference voltage, and an anode of the first equivalent diode is separately connected to a gate of a first switching transistor and a first end of a first capacitor; a second end of the first switching transistor and a first end of a second switching transistor are connected together; a second end of the second capacitor is separately connected to a cathode of a second equivalent diode and a gate of the second switching transistor; and a second end of the second switching transistor is grounded, and an anode of the second equivalent diode is connected to a reference voltage.

10 Claims, 2 Drawing Sheets

<Prior Art>

LEVEL CONVERSION CIRCUIT AND APPARATUS

CROSS-REFERENCE TO RELATED APPLICATION

This application claims priority to Chinese Patent Application No. 201510287692.7, filed on May 29, 2015, which is hereby incorporated by reference in its entirety.

TECHNICAL FIELD

The present invention relates to the circuit field, and in particular, to a level conversion circuit and an apparatus.

BACKGROUND

In a pipeline analog-to-digital converter, a level conversion circuit is usually used to implement conversion between a high level signal and a low level signal. With an increasingly high requirement for a speed indicator of the pipeline analog-to-digital converter, improving a speed of the level conversion circuit becomes one means of improving a speed of the pipeline analog-to-digital converter.

As shown in FIG. 1, a level conversion circuit used in the prior art includes a PMOS (P-type metal-oxide-semiconductor) transistor T1, a PMOS transistor T2, an NMOS (N-type metal-oxide-semiconductor) transistor T3, an NMOS transistor T4, and a phase inverter, where both a source of T1 and a source of T2 are connected to a power supply positive electrode AVDD, a drain of T1 is connected to a gate of T2, a gate of T1 is connected to a drain of T2, a gate of T3 is connected to an output end clk of a square wave generation circuit, a source of T3 is connected to a source of T4 and is grounded, a drain of T3 is connected to the drain of T1, a gate of T4 is connected to the gate of T3 by using the phase inverter, and a drain of T4 is connected to the drain of T2 and is used as an output end clkout of the level conversion circuit for connecting to a load. A specific working principle is as follows: It is assumed that a value of AVDD is 2 V, a lowest voltage value of a signal output by the square wave generation circuit is 0 V, and a highest voltage value is 1 V. When clk=0 V, a gate voltage of T3 is 0 V, and T3 is cut off, whereas a gate voltage of T4 is converted into 1 V by using the phase inverter and therefore T4 is conducted. In this case, clkout=0 V. In this case, T1 is conducted because a gate voltage of T1 is less than a source voltage of T1; T2 is cut off because a gate voltage of T2 is AVDD=2 V. When clk=1 V, T3 is conducted because the gate voltage of T3 is greater than a source voltage of T3, and T4 is cut off. A drain voltage of T3 and the gate voltage of T2 are 0. T2 is conducted because the gate voltage of T2 is less than a source voltage of T2. In this case, clkout=AVDD=2 V, and T1 is cut off. In this way, level signal conversion is completed.

However, in the foregoing implementation process, when clk changes from zero to a highest voltage, states of T1, T2, and T3 change in the following sequence: first T3 is conducted, then T2 can be conducted, and finally T1 changes from a conducted state to a cut-off state. That is, in a process in which T3 changes from a cut-off state to a conducted state, a status in which both T3 and T1 are conducted exists. Therefore, the drain voltage of T3 cannot immediately change to 0 V but instead, gradually changes from an intermediate value of AVDD to 0 V. As a result, a conducting speed of T2 slows down, and further a speed at which clkout changes from 0 to AVDD becomes slow. That is, a conversion speed of the level conversion circuit is decreased.

SUMMARY

Embodiments of the present invention provide a level conversion circuit and an apparatus, so as to improve a conversion speed of the level conversion circuit.

To achieve the foregoing objective, the following technical solutions are adopted in the embodiments of the present invention:

According to a first aspect, an embodiment of the present invention provides a level conversion circuit, including: a first equivalent diode, a first switching transistor, a second switching transistor, a second equivalent diode, a first capacitor, and a second capacitor; where a cathode of the first equivalent diode is connected to a first reference voltage, and an anode of the first equivalent diode is separately connected to a gate of the first switching transistor and a first end of the first capacitor; a first end of the first switching transistor is connected to a second reference voltage, and both a second end of the first switching transistor and a first end of the second switching transistor are connected to an output voltage; both a second end of the first capacitor and a first end of the second capacitor are connected to an input voltage; a second end of the second capacitor is separately connected to a cathode of the second equivalent diode and a gate of the second switching transistor; and a second end of the second switching transistor is grounded, and an anode of the second equivalent diode is connected to a third reference voltage; where the input voltage is switched between zero and a first voltage; $V2-G1-W1 \leq V1 < V2-W1$; and $W2 < V3 \leq G2+W2$; where, V1, V2, and V3 are respectively the first reference voltage, the second reference voltage, and the third reference voltage; W1 is a conduction voltage drop of the first equivalent diode, G1 is a threshold voltage of the first switching transistor, G2 is a threshold voltage of the second switching transistor, and W2 is a conduction voltage drop of the second equivalent diode; and the first voltage is greater than the conduction voltage drop of the first equivalent diode, the first voltage is greater than the threshold voltage of the second switching transistor, and the first voltage is greater than the threshold voltage of the first switching transistor; when the input voltage is zero, the anode and the cathode of the first equivalent diode are cut off, and the anode and the cathode of the second equivalent diode are conducted; and when the input voltage changes from zero to the first voltage, the anode and the cathode of the first equivalent diode are conducted; a voltage difference between the anode and the cathode of the second equivalent diode is not greater than the conduction voltage drop of the second equivalent diode, and the anode and the cathode of the second equivalent diode are cut off; an absolute value of a voltage difference between the gate and the first end of the first switching transistor is not greater than the threshold voltage of the first switching transistor, and the first end and the second end of the first switching transistor are cut off; and an absolute value of a voltage difference between the gate and the second end of the second switching transistor is greater than the threshold voltage of the second switching transistor, and the first end and the second end of the second switching transistor are conducted, so that the output voltage is zero.

With reference to the first aspect, in a first possible implementation manner of the first aspect, when the input voltage changes from the first voltage to zero, a voltage difference between the anode and the cathode of the first equivalent diode is not greater than the conduction voltage drop of the first equivalent diode, and the anode and the cathode of the first equivalent diode are cut off; the voltage difference between the anode and the cathode of the second equivalent diode is equal to the conduction voltage drop of the second equivalent diode, and the second equivalent diode is in a pre-conducted state; and the absolute value of the voltage difference between the gate and the first end of the first switching transistor is greater than the threshold voltage of the first switching transistor, and the first end and the second end of the first switching transistor are conducted; the absolute value of the voltage difference between the gate and the second end of the second switching transistor is not greater than the threshold voltage of the second switching transistor, and the first end and the second end of the second switching transistor are cut off, so that the output voltage is the second reference voltage.

With reference to the first aspect or the first possible implementation manner of the first aspect, in a second possible implementation manner of the first aspect, V1=V2−G1−W1; V3=G2+W2.

With reference to the first possible implementation manner of the first aspect, in a third possible implementation manner of the first aspect, the circuit further includes a phase inverter; where an output end of the phase inverter is connected to the input voltage, and the phase inverter is configured to output the input voltage.

With reference to the first possible implementation manner of the first aspect, in a fourth possible implementation manner of the first aspect, the first equivalent diode includes a first P-type metal-oxide-semiconductor PMOS transistor, where a gate and a drain of the first PMOS transistor are connected and used as the cathode of the first equivalent diode, and a source of the first PMOS transistor is used as the anode of the first equivalent diode.

With reference to the first possible implementation manner of the first aspect, in a fifth possible implementation manner of the first aspect, the first switching transistor includes a second PMOS transistor, where a gate of the second PMOS transistor is used as the gate of the first switching transistor, a source of the second PMOS transistor is used as the first end of the first switching transistor, and a drain of the second PMOS transistor is used as the second end of the first switching transistor.

With reference to the first possible implementation manner of the first aspect, in a sixth possible implementation manner of the first aspect, the second switching transistor includes a first N-type metal-oxide-semiconductor NMOS transistor, where a drain of the first NMOS transistor is used as the first end of the second switching transistor, a source of the first NMOS transistor is used as the second end of the second switching transistor, and a gate of the first NMOS transistor is used as the gate of the second switching transistor.

With reference to the first possible implementation manner of the first aspect, in a seventh possible implementation manner of the first aspect, the second equivalent diode includes a second NMOS transistor, where a source of the second NMOS transistor is used as the cathode of the second equivalent diode, and a gate and a drain of the second NMOS transistor are connected and used as the anode of the second equivalent diode.

With reference to any one of the fifth to the seventh possible implementation manners of the first aspect, in an eighth possible implementation manner of the first aspect, a result acquired by subtracting a capacitance of a parasitic capacitor of the gate of the second PMOS transistor from a capacitance of the first capacitor is less than a preset value; and a result acquired by subtracting a capacitance of a parasitic capacitor of the gate of the first NMOS transistor from a capacitance of the second capacitor is less than the preset value; where the preset value is greater than zero.

According to a second aspect, an embodiment of the present invention provides an electronic device, including the level conversion circuit described in the foregoing embodiment.

The embodiments of the present invention provide the level conversion circuit and the apparatus, where the level conversion circuit includes: a first equivalent diode, a first switching transistor, a second switching transistor, a second equivalent diode, a first capacitor, and a second capacitor. In addition, an input voltage is switched between zero and a first voltage; V2−G1−W1≤V1<V2−W1; W2<V3≤G2+W2; the first voltage is greater than a conduction voltage drop of the first equivalent diode, the first voltage is greater than a threshold voltage of the second switching transistor, and the first voltage is greater than a threshold voltage of the first switching transistor. When the input voltage is zero, the second switching transistor is in a sub-threshold state, but is still cut off. However, when the input voltage changes from zero to the first voltage, the second switching transistor changes from a sub-threshold state to a conducted state, so that an output voltage of the level conversion circuit is 0 V, and voltage converting from the first voltage of the input voltage to 0 V of the output voltage is implemented. In this way, when the input voltage is zero, $0<VQ2_{gate}-VQ2_{second}\leq G2$, and the second switching transistor is in a sub-threshold state. Therefore, when the input voltage changes from zero to the first voltage, as long as a voltage difference between a first end and a gate of the second switching transistor changes from a value between 0 V and G2 to a value greater than the threshold voltage G2 of the second switching transistor, the second switching transistor can be immediately conducted without changing from 0 V to a sub-threshold state as a transit state before changing to a fully conducted state, and a conversion speed of the level conversion circuit is finally increased. Further, it may be learned from a capacitor feature that, when receiving a transient signal, the capacitor has a no-delay function; therefore, when a received signal changes from zero to the first voltage or changes from the first voltage to zero, both the first capacitor and the second capacitor in the present invention have a no-delay function, and a conversion speed of the level conversion circuit is further increased.

BRIEF DESCRIPTION OF THE DRAWINGS

To describe the technical solutions in the embodiments of the present invention more clearly, the following briefly introduces the accompanying drawings required for describing the embodiments or the prior art. Apparently, the accompanying drawings in the following description show merely some embodiments of the present invention, and persons of ordinary skill in the art may still derive other drawings from these accompanying drawings without creative efforts.

DETAILED DESCRIPTION

Figure 1:
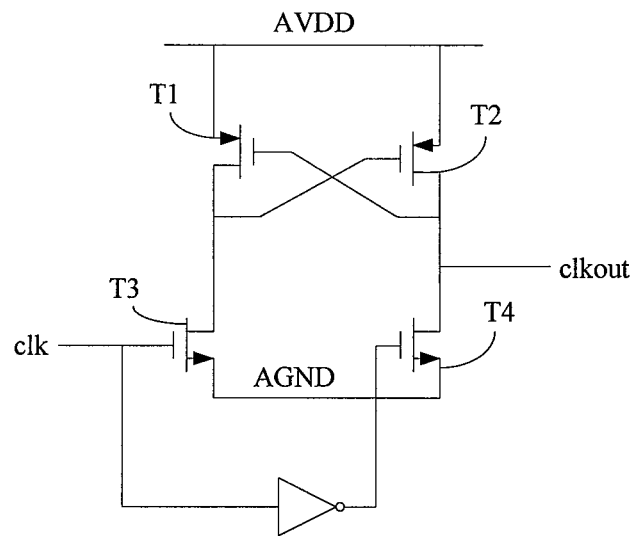
FIG. 1 is a schematic diagram of a level conversion circuit in the prior art.

The following clearly describes the technical solutions in the embodiments of the present invention with reference to the accompanying drawings in the embodiments of the present invention. Apparently, the described embodiments are merely some but not all of the embodiments of the present invention. All other embodiments obtained by persons of ordinary skill in the art based on the embodiments of the present invention without creative efforts shall fall within the protection scope of the present invention.

For ease of description, various voltages in all embodiments of the present invention are represented according to the following abbreviation manners: V1, V2, and V3 are respectively a first reference voltage, a second reference voltage, and a third reference voltage; W1 and W2 are respectively a conduction voltage drop of a first equivalent diode and a conduction voltage drop of a second equivalent diode; G1 and G2 are respectively a threshold voltage of a first switching transistor and a threshold voltage of a second switching transistor; $C1_{upper}$ indicates a voltage of an upper plate of a first capacitor; $C1_{lower}$ indicates a voltage of a lower plate of the first capacitor; $C1_{upper\_lower}$ indicates a voltage difference between the upper plate and the lower plate of the first capacitor; $C2_{upper}$ indicates a voltage of an upper plate of a second capacitor; $C2_{lower}$ indicates a voltage of a lower plate of the second capacitor; $C2_{lower\_upper}$ indicates a voltage difference between the lower plate and the upper plate of the second capacitor; $VD1_{anode}$ indicates an anode voltage of a first equivalent diode; $VD1_{cathode}$ indicates a cathode voltage of the first equivalent diode; $VD2_{anode}$ indicates an anode voltage of a second equivalent diode; $VD2_{cathode}$ indicates a cathode voltage of the second equivalent diode; $VQ1_{gate}$ indicates a gate voltage of a first switching transistor; $VQ1_{first}$ indicates a voltage of a first end of the first switching transistor; $VQ1_{second}$ indicates a voltage of a second end of the first switching transistor; $VQ2_{gate}$ indicates a gate voltage of a second switching transistor; $VQ2_{first}$ indicates a voltage of a first end of the second switching transistor; $VQ2_{second}$ indicates a voltage of a second end of the second switching transistor. Reference numerals: D1—first equivalent diode; D2—second equivalent diode; Q1—first switching transistor; Q2—second switching transistor; C1—first capacitor; C2—second capacitor; F—phase inverter.

Figure 2:
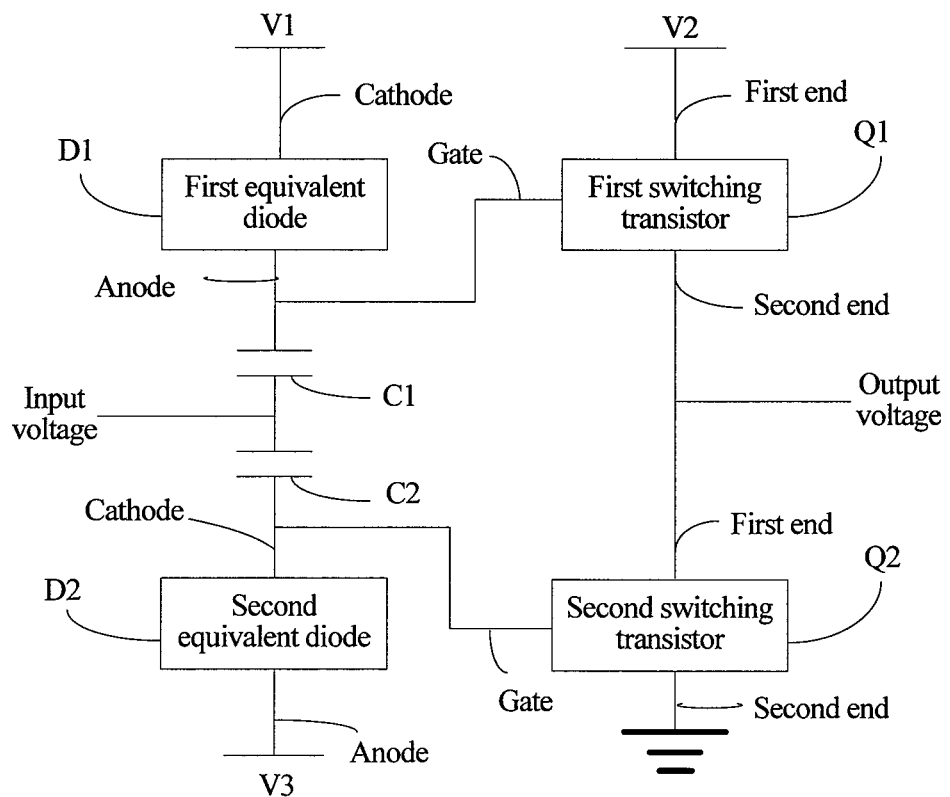
FIG. 2 is a schematic diagram of a level conversion circuit according to an embodiment of the present invention.
Figure 3:
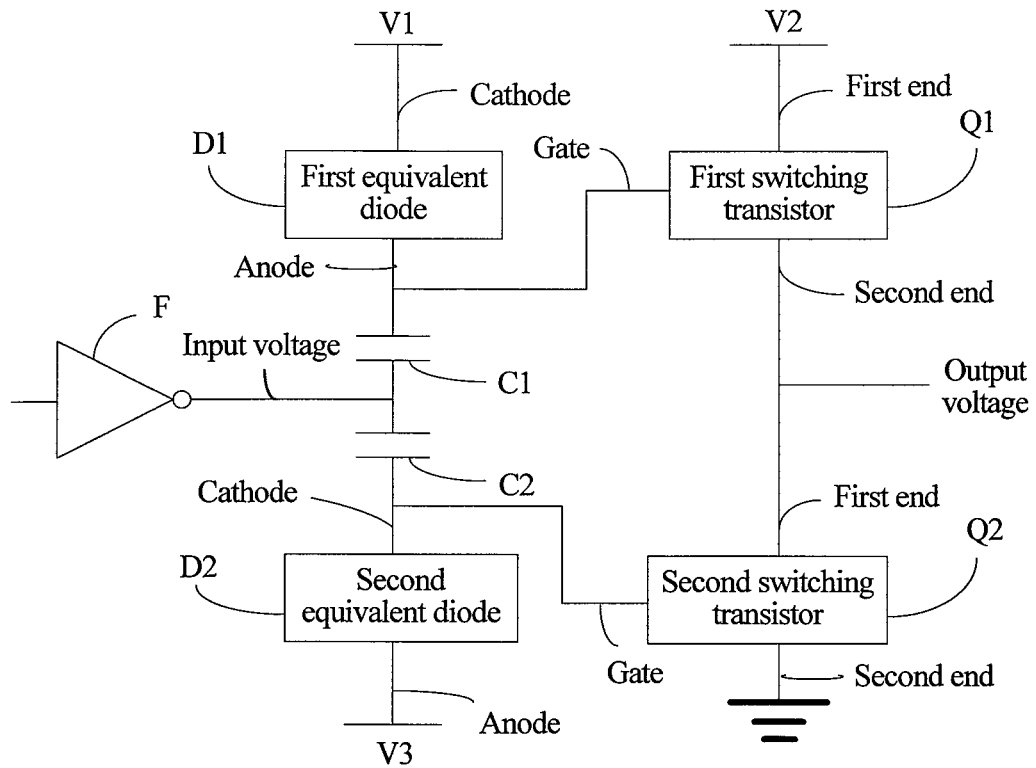
FIG. 3 is another schematic diagram of a level conversion circuit according to an embodiment of the present invention.
Figure 4:
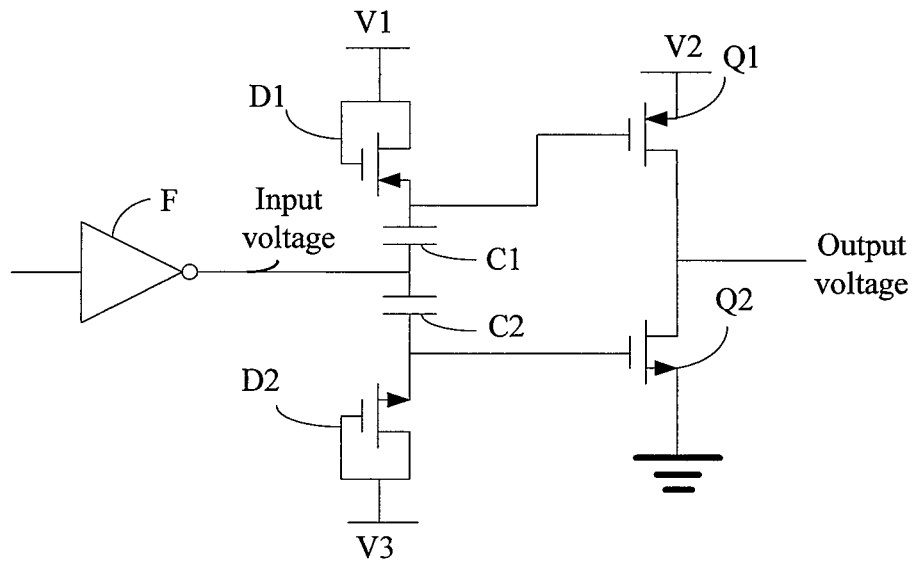
FIG. 4 is another schematic diagram of a level conversion circuit according to an embodiment of the present invention.

It should be noted that in FIG. 2, FIG. 3, and FIG. 4 of the embodiments of the present invention, a first end of the first capacitor is a plate separately connected to an anode of the first equivalent diode and a gate of the first switching transistor, that is, the upper plate of the first capacitor; a second end of the first capacitor is a plate connected to an input voltage, that is, the lower plate of the first capacitor. A first end of the second capacitor is a plate connected to the input voltage, that is, the upper plate of the second capacitor; a second end of the second capacitor is a plate separately connected to a cathode of the second equivalent diode and a gate of the second switching transistor, that is, the lower plate of the second capacitor.

An embodiment of the present invention provides a level conversion circuit, including a first equivalent diode D1, a first switching transistor Q1, a second switching transistor Q2, a second equivalent diode D2, a first capacitor C1, and a second capacitor C2, as shown in FIG. 2.

A cathode of the first equivalent diode is connected to a first reference voltage, and an anode of the first equivalent diode is separately connected to a gate of the first switching transistor and a first end of the first capacitor; a first end of the first switching transistor is connected to a second reference voltage, and both a second end of the first switching transistor and a first end of the second switching transistor are connected to an output voltage; both a second end of the first capacitor and a first end of the second capacitor are connected to an input voltage; a second end of the second capacitor is separately connected to a cathode of the second equivalent diode and a gate of the second switching transistor; a second end of the second switching transistor is grounded, and an anode of the second equivalent diode is connected to a third reference voltage.

$V2-G1-W1 \leq V1 < V2-W1$; $W2 < V3 \leq G2+W2$; the input voltage is switched between zero and a first voltage; the first voltage is greater than the conduction voltage drop of the first equivalent diode, the first voltage is greater than the threshold voltage of the second switching transistor, and the first voltage is greater than the threshold voltage of the first switching transistor.

When the input voltage is zero, the anode and the cathode of the first equivalent diode are cut off, and the anode and the cathode of the second equivalent diode are conducted.

Specifically, when the input voltage is zero, because the first equivalent diode is reverse-biased, the anode and the cathode of the first equivalent diode are cut off.

Specifically, when the input voltage is zero, because a leakage current exists in the second equivalent diode, the anode and the cathode of the second equivalent diode are conducted, and a cathode voltage of the second equivalent diode is $VD2_{anode}=V3-W2$. Further, because the gate of the second switching transistor is connected to the cathode of the second equivalent diode, a gate voltage of the second switching transistor is $VQ2_{gate}=VD2_{cathode}=V3-W2$. Because the second end of the second switching transistor is grounded, that is, $VQ2_{second}=0$ V, a voltage difference between the gate of the second switching transistor and the second end of the second switching transistor is $VQ2_{gate}-VQ2_{second}=VQ2_{gate}=V3-W2$. Because $W2<V3 \leq G2+W2$, $0<VQ2_{gate}-VQ2_{second} \leq G2$, and in this case, the second switching transistor is in a sub-threshold state, but the first end and the second end of the second switching transistor are still cut off.

When the input voltage changes from zero to the first voltage, the anode and the cathode of the first equivalent diode are conducted; an absolute value of a voltage difference between the gate and the first end of the first switching transistor is not greater than the threshold voltage of the first switching transistor, and the first end and the second end of the first switching transistor are cut off; a voltage difference between the anode and the cathode of, the second equivalent diode is not greater than the conduction voltage drop of the second equivalent diode, and the anode and the cathode of the second equivalent diode are cut off; an absolute value of a voltage difference between the gate and the second end of the second switching transistor is greater than the threshold voltage of the second switching transistor, and the first end and the second end of the second switching transistor are conducted, so that the output voltage is zero.

Specifically, when the input voltage changes from zero to the first voltage, because the second end (that is, the lower plate of the first capacitor) of the first capacitor is connected to the input voltage, a voltage (that is, the voltage $C1_{lower}$ of the lower plate of the first capacitor) of the second end of the first capacitor changes from zero to the first voltage. To ensure that a voltage difference between the two ends of the first capacitor is unchanged, a voltage (that is, the voltage $C1_{upper}$ of the upper plate of the first capacitor) of the first end of the first capacitor also increases by the first voltage. Because the anode of the first equivalent diode is connected to the first end (that is, the upper plate of the first capacitor) of the first capacitor, an anode voltage $VD1_{anode}$ of the first equivalent diode increases by the first voltage. Because a cathode voltage $VD1_{cathode}$ of the first equivalent diode is unchanged, the anode voltage $VD1_{anode}$ of the first equivalent diode increases by the first voltage, and the first voltage is greater than the conduction voltage drop W1 of the first equivalent diode, the anode and the cathode of the first equivalent diode are conducted.

Specifically, when the input voltage changes from zero to the first voltage, the anode and the cathode of the first equivalent diode are conducted, and the anode voltage of the first equivalent diode is equal to the cathode voltage of the first equivalent diode plus the conduction voltage drop of the first equivalent diode, that is, $VD1_{anode}=VD1_{cathode}+W1$. Because the cathode of the first equivalent diode is connected to the first reference voltage V1, the cathode voltage of the first equivalent diode is $VD1_{cathode}=V1$, and the anode voltage of the first equivalent diode is $VD1_{anode}=VD1_{cathode}+W1=V1+W1$. Because the gate of the first switching transistor is connected to the anode of the first equivalent diode, the gate voltage of the first switching transistor is $VQ1_{gate}=VD1_{anode}=V1+W1$. Because the first end of the first switching transistor is connected to the second reference voltage V2, a voltage of the first end of the first switching transistor is $VQ1_{first}=V2$, a voltage difference between the first end of the first switching transistor and the gate of the first switching transistor is $VQ1_{first}-VQ1_{gate}=V2-(V1+W1)=V2-V1-W1$. Because $V2-G1-W1 \leq V1 < V2-W1$, $0 < VQ1_{first}-VQ1_{gate} \leq G1$. In this case, the first switching transistor is in a sub-threshold state, but the first end and the second end of the first switching transistor are still cut off.

Specifically, because when the input voltage is zero, the first end (that is, the upper plate of the second capacitor) of the second capacitor is connected to the input voltage, a voltage (that is, the voltage of the upper plate of the second capacitor) of the first end of the second capacitor is $C2_{upper}=0$ V. In addition, when the input voltage is zero, the anode and the cathode of the second equivalent diode are conducted, and the voltage of the cathode of the second equivalent diode is $VD2_{cathode}=VD2_{anode}-W2$. Further, because the anode of the second equivalent diode is connected to the third reference voltage V3, that is, $VD2_{anode}=V3$, the voltage of the cathode of the second equivalent diode is $VD2_{cathode}=V3-W2$. Because the second end (that is, the lower plate of the second capacitor) of the second capacitor is connected to the cathode of the second equivalent diode, a voltage (that is, the voltage of the lower plate of the second capacitor) of the second end of the second capacitor is $C2_{lower}=VD2_{cathode}=V3-W2$. Therefore, when the input voltage is zero, a voltage difference between the second end of the second capacitor and the first end of the second capacitor is $C2_{lower\_upper}=C2_{lower}-C2_{upper}=V3-W2-0=V3-W2$. When the input voltage changes from zero to the first voltage, the first end (that is, the upper plate of the second capacitor) of the second capacitor is connected to the input voltage, the voltage $C2_{upper}$ (that is, the voltage of the upper plate of the second capacitor) of the first end of the second capacitor changes from 0 V to the first voltage. To ensure that the voltage difference between two ends of the second capacitor $C2_{lower}-C2_{upper}=V3-W2$ is unchanged, the voltage (that is, the voltage of the lower plate of the second capacitor) of the second end of the second capacitor also increases by the first voltage, that is, $C2_{lower}=V3-W2+$first voltage. Because the cathode of the second equivalent diode is connected to the second end (that is, the lower plate of the second capacitor) of the second capacitor, the cathode voltage of the second equivalent diode is $VD2_{cathode}=C2_{lower}=V3-W2+$first voltage. In addition, because the anode of the second equivalent diode is connected to the third reference voltage V3, and the voltage of the anode of the second equivalent diode is $VD2_{anode}=V3$, a voltage difference between the anode of the second equivalent diode and the cathode of the second equivalent diode is $VD2_{anode}-VD2_{cathode}=V3-(V3-W2+$first voltage$)=W2-$first voltage. Because $VD2_{anode}-VD2_{cathode}=W2-$first voltage$<W2$, the anode and the cathode of the second equivalent diode are cut off.

Specifically, when the input voltage changes from zero to the first voltage, it may be learned from analysis of the previous paragraph that the voltage (that is, the voltage of the lower plate of the second capacitor) of the second end of the second capacitor is $C2_{lower}=V3-W2+$first voltage. Because the second end (that is, the lower plate of the second capacitor) of the second capacitor is connected to the gate of the second switching transistor, the gate voltage of the second switching transistor is equal to the voltage (that is, the voltage of the lower plate of the second capacitor) of the second end of the second capacitor, that is, $VQ2_{gate}=C2_{lower}=V3-W2+$first voltage. Further, because the second end of the second switching transistor is grounded, and the voltage of the second end of the second switching transistor is $VQ2_{second}=0$ V, the voltage difference between the gate of the second switching transistor and the second end of the second switching transistor is $VQ2_{gate}-VQ2_{second}=V3-W2+$first voltage$-0=V3-W2+$first voltage. Because $W2<V3 \leq G2+W2$, first voltage$<VQ2_{gate}-VQ2_{second} \leq G2+$first voltage; further, because the first voltage is greater than the threshold voltage G2 of the second switching transistor, $VQ2_{gate}-VQ2_{second}>G2$, and the first end and the second end of the second switching transistor are conducted. Further, because the first end of the second switching transistor is connected to the output voltage, and the output voltage is equal to the voltage of the second end of the second switching transistor, the output voltage is 0 V.

It should be noted that the input voltage is generated by a signal generation circuit, and the signal generation circuit may be a square wave signal generation circuit in the prior art. For a specific circuit, refer to the square wave signal generation circuit in the prior art, and details are not described herein again in the present invention.

The present invention analyzes the level conversion circuit only at a moment when an input voltage is zero or a highest voltage. Analysis of the level conversion circuit at another moment is similar to that of this moment, which is not described herein again.

This embodiment of the present invention provides the level conversion circuit, including: a first equivalent diode, a first switching transistor, a second switching transistor, a second equivalent diode, a first capacitor, and a second capacitor. In addition, the input voltage is switched between zero and a first voltage; $V2-G1-W1 \leq V1 < V2-W1$; $W2<V3 \leq G2+W2$; the first voltage is greater than the conduction voltage drop of the first equivalent diode, the first voltage is greater than the threshold voltage of the second switching transistor, and the first voltage is greater than the threshold voltage of the first switching transistor. When the input voltage is zero, the second switching transistor is in a sub-threshold state, but is still cut off. However, when the input voltage changes from zero to the first voltage, the second switching transistor changes from a sub-threshold state to a conducted state, so that an output voltage of the level conversion circuit is 0 V, and voltage converting from the first voltage of the input voltage to 0 V of the output voltage is implemented. In this way, when the input voltage is zero, $0<VQ2_{gate}-VQ2_{second}\leq G2$, and the second switching transistor is in a sub-threshold state. Therefore, when the input voltage changes from zero to the first voltage, as long as a voltage difference between a first end and a gate of the second switching transistor changes from a value between 0 V and G2 to a value greater than the threshold voltage G2 of the second switching transistor, the second switching transistor can be immediately conducted without changing from 0 V to a sub-threshold state as a transit state before changing to a fully conducted state, and a conversion speed of the level conversion circuit is finally improved. Further, it may be learned from a capacitor feature that when receiving a transient signal, the capacitor has a no-delay function, and therefore when a received signal changes from zero to the first voltage or changes from the first voltage to zero, both the first capacitor and the second capacitor in the present invention have a no-delay function, and a conversion speed of the level conversion circuit is further improved.

Further, when the input voltage changes from the first voltage to zero, a voltage difference between the anode and the cathode of the first equivalent diode is not greater than the conduction voltage drop of the first equivalent diode, and the anode and the cathode of the first equivalent diode are cut off; the absolute value of the voltage difference between the gate and the first end of the first switching transistor is greater than the threshold voltage of the first switching transistor, and the first end and the second end of the first switching transistor are conducted; the voltage difference between the anode and the cathode of the second equivalent diode is equal to the conduction voltage drop of the second equivalent diode, and the second equivalent diode is in a pre-conducted state; and the absolute value of the voltage difference between the gate and the second end of the second switching transistor is not greater than the threshold voltage of the second switching transistor, and the first end and the second end of the second switching transistor are cut off, so that the output voltage is the second reference voltage.

Specifically, when the input voltage changes from zero to the first voltage, because the second end (that is, the lower plate of the first capacitor) of the first capacitor is connected to the input voltage, a voltage (that is, the voltage of the lower plate of the first capacitor) of the second end of the first capacitor is $C1_{lower}$=first voltage. In addition, when the input voltage changes from zero to the first voltage, the anode and the cathode of the first equivalent diode are conducted. Because the cathode of the first equivalent diode is connected to the first reference voltage V1, and the cathode voltage of the first equivalent diode is $VD1_{cathode}=V1$, the anode voltage of the first equivalent diode is $VD1_{anode}=V1+W1$. Because the first end (that is, the upper plate of the first capacitor) of the first capacitor is connected to the anode of the first equivalent diode, the voltage (that is, the voltage of the upper plate of the first capacitor) of the first end of the first capacitor is $C1_{upper}=VD1_{anode}=V1+W1$. Therefore, a voltage difference between the upper plate and the lower plate of the first capacitor is $C1_{upper\_lower}=C1_{upper}-C1_{lower}=V1+W1-$first voltage. When the input voltage changes from the first voltage to zero, the voltage of the lower plate of the first capacitor is zero, that is, $C1_{lower}=0$ V. To ensure that a voltage of the first capacitor does not change suddenly, that is, the voltage difference between the upper plate and the lower plate of the first capacitor is $C1_{upper\_lower}=V1+W1-$first voltage, the voltage of the upper plate of the first capacitor is $C1_{upper}=V1+W1-$first voltage. Because the anode of the first equivalent diode is connected to the first end (that is, the upper plate of the first capacitor) of the first capacitor, the anode voltage of the first equivalent diode is $VD1_{anode}=C1_{upper}=V1+W1-$first voltage. The voltage difference between the anode of the first equivalent diode and the cathode of the first equivalent diode is $VD1_{anode}-VD1_{cathode}=V1+W1-$first voltage$-V1=W1-$first voltage$<W1$, and therefore the anode and the cathode of the first equivalent diode are cut off.

Specifically, it may be learned from analysis of the previous paragraph that when the input voltage changes from the first voltage to zero, the voltage of the upper plate of the first capacitor is $C1_{upper}=V1+W1-$first voltage. Because the gate of the first switching transistor is connected to the first end (the upper plate of the first capacitor) of the first capacitor, the gate voltage of the first switching transistor is $VQ1_{gate}=C1_{upper}=V1+W1-$first voltage. Further, because the first end of the first switching transistor is connected to the second reference voltage V2, and the voltage of the first end of the first switching transistor is $VQ1_{first}=V2$, the voltage difference between the first end of the first switching transistor and the gate of the first switching transistor is $VQ1_{first}-VQ1_{gate}=V2-(V1+W1-$first voltage). Further, because $V2-G1-W1\leq V1<V2-W1$, first voltage$<VQ1_{first}-VQ1_{gate}\leq G1+$first voltage. Because the first voltage is greater than the threshold voltage G1 of the first switching transistor, $G1<VQ1_{first}-VQ1_{gate}$, and the first end and the second end of the first switching transistor are conducted. Because the first end of the first switching transistor is connected to the second reference voltage, and the second end of the first switching transistor is connected to the output voltage, the output voltage is the second reference voltage.

Specifically, it may be learned from the foregoing analysis that when the input voltage is zero, the voltage difference between the second end of the second capacitor and the first end of the second capacitor is $C2_{lower}-C2_{upper}=V3-W2$. When the input voltage changes from the first voltage to zero, the first end (that is, the upper plate of the second capacitor) of the second capacitor is connected to the input voltage, the voltage $C2_{upper}$ (that is, the voltage of the upper plate of the second capacitor) of the first end of the second capacitor changes from the first voltage to 0 V. To ensure that the voltage difference between two ends of the second capacitor $C2_{lower}-C2_{upper}=V3-W2$ is unchanged, the voltage (that is, the voltage of the lower plate of the second capacitor) of the second end of the second capacitor is $C2_{lower}=V3-W2$. Because the cathode of the second equivalent diode is connected to the second end (that is, the lower plate of the second capacitor) of the second capacitor, the cathode voltage of the second equivalent diode is $VD2_{cathode}=C2_{lower}=V3-W2$. In addition, because the anode of the second equivalent diode is connected to the third reference voltage V3, and the anode voltage of the second equivalent diode is $VD2_{anode}=V3$, the voltage difference between the anode of the second equivalent diode and the cathode of the second equivalent diode is $VD2_{anode}-VD2_{cathode}=V3-(V3-W2)=W2$. Because $VD2_{anode}-VD2_{cathode}=W2$, the second equivalent diode is in a pre-conducted state.

Specifically, it may be learned from analysis of the previous paragraph that when the input voltage changes from the first voltage to zero, the voltage (that is, the voltage of the lower plate of the second capacitor) of the second end of the second capacitor is $C2_{lower}=V3-W2$. Because the gate of the second switching transistor is connected to the second end (the lower plate of the second capacitor) of the second capacitor, the gate voltage of the second switching transistor is $VQ2_{gate}=C2_{lower}=V3-W2$. In addition, because the second end of the second switching transistor is grounded, and the voltage of the second end of the second switching transistor is $VQ2_{second}=0$ V, the voltage difference between the gate of the second switching transistor and the second end of the second switching transistor is $VQ2_{gate}-VQ2_{second}=V3-W2-0=V3-W2$. Because $W2<V3\leq G2+W2$, $0<VQ2_{gate}-VQ2_{second}\leq G2$, the second switching transistor is in a sub-threshold state, and the first end and the second end of the second switching transistor are cut off.

Further, $V1=V2-G1-W1$; $V3=G2+W2$.

When the input voltage is zero, it may be learned from analysis of FIG. 2 that because a leakage current exists in the second equivalent diode, the anode and the cathode of the second equivalent diode are conducted. In this case, the gate voltage of the second switching transistor is $VQ2_{gate}=VD2_{cathode}=V3-W2$. Because the second end of the second switching transistor is grounded, that is, $VQ2_{second}=0$ V, the voltage difference between the gate of the second switching transistor and the second end of the second switching transistor is $VQ2_{gate}-VQ2_{second}=VQ2_{gate}=V3-W2$. Because $V3=G2+W2$, $VQ2_{gate}-VQ2_{second}=G2$, and in this case, the second switching transistor is in a pre-conducted state.

Therefore, in a case in which $V3=G2+W2$, when the input voltage is zero, the second switching transistor is in a pre-conducted state, and when the input voltage changes from zero to the first voltage, the first end and the second end of the second switching transistor are conducted, and the output voltage is 0 V. In this case, the second switching transistor may directly change from a pre-conducted state to a conducted state, that is, once the input voltage changes, the second switching transistor is immediately conducted without changing from 0 V to a sub-threshold state as a transit state before changing to a fully conducted state, and a conversion speed of the level conversion circuit is further improved.

When the input voltage changes from zero to the first voltage, the anode and cathode of the first equivalent diode are conducted. Because the anode and cathode of the first equivalent diode are conducted, $VD1_{anode}=VD1_{cathode}+W1=V1+W1$, the gate voltage of the first switching transistor $VQ1_{gate}=VD1_{anode}=V1+W1$. Because the voltage of the first end of the first switching transistor is $VQ1_{first}=V2$, the voltage difference between the first end of the first switching transistor and the gate of the first switching transistor is $VQ1_{first}-VQ1_{gate}=V2-(V1+W1)=V2-V1-W1$. Because $V1=V2-G1-W1$, $VQ1_{first}-VQ1_{gate}=G1$, and in this case, the first switching transistor is in a pre-conducted state.

Therefore, in a case in which $V1=V2-G1-W1$, when the input voltage changes from zero to the first voltage, the first switching transistor is in a pre-conducted state, and when the input voltage changes from the first voltage to zero, the first end and the second end of the first switching transistor are conducted, and the output voltage is the second reference voltage. In this case, the first switching transistor may directly change from a pre-conducted state to a conducted state, that is, once the input voltage changes, the first switching transistor is immediately conducted without changing from 0 V to a sub-threshold state as a transit state before changing to a fully conducted state, and a conversion speed of the level conversion circuit is further improved.

Further, as shown in FIG. 3, the circuit further includes a phase inverter F.

An output end of the phase inverter is connected to the input voltage and is configured to output the input voltage.

It should be noted that because after the input voltage is generated, a loss may exist in a process of transmitting the input voltage to the level conversion circuit, and a rising edge and a falling edge between a zero-voltage and a highest voltage of the input voltage become flat. The phase inverter is added in front of the input voltage, so that a change of the rising edge and the falling edge of the input voltage is accelerated, and a conversion speed of the input voltage is improved.

When a voltage input into the phase inverter maintains a high voltage, a voltage output by the phase inverter maintains zero.

When the voltage input into the phase inverter changes from the high voltage to zero, the input voltage processed by the phase inverter changes from zero to the first voltage.

When the voltage input into the phase inverter changes from zero to the high voltage, the input voltage processed by the phase inverter changes from the first voltage to zero.

Further, as shown in FIG. 4, the first equivalent diode includes a first PMOS (P-type metal-oxide-semiconductor) transistor, the first switching transistor includes a second PMOS transistor, the second switching transistor includes a first NMOS (N-type metal-oxide-semiconductor) transistor, and the second equivalent diode include a second NMOS transistor.

A gate and a drain of the first PMOS transistor are connected and used as the cathode of the first equivalent diode, and a source of the first PMOS transistor is used as the anode of the first equivalent diode. A gate of the second PMOS transistor is used as the gate of the first switching transistor, a source of the second PMOS transistor is used as the first end of the first switching transistor, and a drain of the second PMOS transistor is used as the second end of the first switching transistor. A drain of the first NMOS transistor is used as the first end of the second switching transistor, a source of the first NMOS transistor is used as the second end of the second switching transistor, and a gate of the first NMOS transistor is used as the gate of the second switching transistor. A source of the second NMOS transistor is used as the cathode of the second equivalent diode, and a gate and a drain of the second NMOS transistor are connected and used as the anode of the second equivalent diode.

When the voltage input into the phase inverter maintains a high voltage, the voltage output by the phase inverter maintains zero. It may be learned from analysis of FIG. 2 that the source of the first PMOS transistor and an end at which the gate and the drain of the first PMOS transistor are located are cut off; an end at which the gate and the drain of the second NMOS transistor are located and the source of the second NMOS transistor are conducted, and the first NMOS transistor is in a sub-threshold state, but the drain and the source of the first NMOS transistor are still cut off.

Further, when the voltage input into the phase inverter changes from the high voltage to zero, and the input voltage processed by the phase inverter changes from zero to the first voltage, it may be learned from analysis of FIG. 2 that the source of the first PMOS transistor and the end at which the gate and the drain of the first PMOS transistor are located are conducted; the second PMOS transistor is in a sub-threshold state, but the source and the drain of the second PMOS transistor are still cut off; the end at which the gate and the drain of the second NMOS transistor are located and the source of the second NMOS transistor are cut off; the drain and the source of the first NMOS transistor are conducted, and further, because the source of the first NMOS transistor is grounded, and the drain of the first NMOS transistor is connected to the output voltage, the output voltage is equal to a source voltage of the first NMOS transistor, and the output voltage is 0 V.

Further, when the voltage input into the phase inverter changes from zero to a highest voltage of the input voltage, and the input voltage processed by the phase inverter changes from the first voltage to zero, it may be learned from analysis of FIG. 2 that the source of the first PMOS transistor and the end at which the gate and the drain of the first PMOS transistor are located are cut off; the source and the drain of the second PMOS transistor are conducted; because the source of the second PMOS transistor is connected to the second reference voltage, and the drain of the second PMOS transistor is connected to the output voltage, the output voltage is the second reference voltage; the second NMOS transistor is in a pre-conducted state; the first NMOS transistor is in a sub-threshold state, and the drain and the source of the first NMOS transistor are cut off.

It should be noted that the gate and the drain of the first PMOS transistor are connected, and the first PMOS transistor is equivalent to a diode and configured to provide a bias voltage for the gate of the second PMOS transistor; the gate and the drain of the second NMOS transistor are connected, and the second NMOS transistor is equivalent to a diode and configured to provide a bias voltage for the gate of the first NMOS transistor.

It should be noted that the first equivalent diode may also be a diode, the first switching transistor may also be a PNP transistor, the second switching transistor may also be an NPN transistor, and the second equivalent diode may also be a diode.

It should be noted that a switching combination included in the level conversion circuit provided in the present invention may further be as follows: the first equivalent diode is a diode, the first switching transistor is a PNP transistor, the second switching transistor is an NPN transistor, and the second equivalent diode is a diode; or may be as follows: the first equivalent diode is a diode, the first switching transistor is a PMOS transistor, a second switching transistor is an NMOS transistor, the second equivalent diode is a diode; or may be as follows: the first equivalent diode is a PMOS transistor, a first switching transistor is a PNP transistor, a second switching transistor is an NPN transistor, and the second equivalent diode is an NMOS transistor, which is not limited in the present invention.

Further, a result acquired by subtracting a capacitance of a parasitic capacitor of the gate of the second PMOS transistor from a capacitance of the first capacitor is less than a preset value.

The preset value is a value greater than zero.

Specifically, it may be learned from a capacitor feature that a capacitor volume is proportional to a capacitor capacitance. A larger capacitor capacitance indicates a larger capacitor volume and a smaller capacitor capacitance indicates a smaller capacitor volume. Therefore, to reduce a volume of the level conversion circuit, on a premise that the capacitance that is of the first capacitor and that is selected in the present invention is greater than the capacitance of the parasitic capacitor of the gate of the second PMOS transistor, a smaller volume of the first capacitor is better.

Further, a result acquired by subtracting a capacitance of a parasitic capacitor of the gate of the first NMOS transistor from a capacitance of the second capacitor is less than the preset value.

Specifically, it may be learned from a capacitor feature that a capacitor volume is proportional to a capacitor capacitance. A larger capacitor capacitance indicates a larger capacitor volume and a smaller capacitor capacitance indicates a smaller capacitor volume. Therefore, to further reduce a volume of the level conversion circuit, on a premise that the capacitance that is of the second capacitor and that is selected in the present invention is greater than the capacitance of the parasitic capacitor of the gate of the first NMOS transistor, a smaller volume of the second capacitor is better.

This embodiment of the present invention provides the level conversion circuit, including: a first equivalent diode, a first switching transistor, a second switching transistor, a second equivalent diode, a first capacitor, and a second capacitor. In addition, the input voltage is switched between zero and a first voltage; $V2-G1-W1 \leq V1 < V2-W1$, and $W2 < V3 \leq G2+W2$, where: V1, V2, and V3 are respectively the first reference voltage, the second reference voltage, and the third reference voltage; W1 is a conduction voltage drop of the first equivalent diode, G1 is a threshold voltage of the first switching transistor, G2 is a threshold voltage of the second switching transistor, and W2 is a conduction voltage drop of the second equivalent diode; the first voltage is greater than the conduction voltage drop of the first equivalent diode, the first voltage is greater than the threshold voltage of the second switching transistor, and the first voltage is greater than the threshold voltage of the first switching transistor. When the input voltage changes from zero to the first voltage, the first switching transistor is in a sub-threshold state, but a first end and a second end of the first switching transistor are still cut off. However, when the input voltage changes from the first voltage to zero, the first switching transistor changes from a sub-threshold state to a conducted state, so that an output voltage of the level conversion circuit is the second reference voltage, and voltage converting from 0 V of the input voltage to the second reference voltage of the output voltage is implemented. In this way, when the input voltage changes from zero to the first voltage, $0 < VQ1_{first} - VQ1_{gate} \leq G1$, and the first switching transistor is in a sub-threshold state. Therefore, when the input voltage changes from the first voltage to zero, as long as a voltage difference between the first end and a gate of the first switching transistor changes from a value between 0 V and G1 to a value greater than the threshold voltage G1 of the first switching transistor, the first switching transistor can be immediately conducted without changing from 0 V to a sub-threshold state as a transit state before changing to a fully conducted state, and a conversion speed of the level conversion circuit is finally improved. Further, a result acquired by subtracting a capacitance of a parasitic capacitor of a gate of a second PMOS transistor from a capacitance of the first capacitor is less than a preset value, and a result acquired by subtracting a capacitance of a parasitic capacitor of a gate of a first NMOS transistor from a capacitance of the second capacitor is less than a preset value. Therefore, a volume of the level conversion circuit is reduced and a structure is simple.

An embodiment of the present invention provides an electronic device, including the level conversion circuit described in the foregoing embodiment.

The electronic device may be an analog to digital converter, a clock circuit, or the like.

This embodiment of the present invention provides an electronic device, including a level conversion circuit. The level conversion circuit includes a first equivalent diode, a first switching transistor, a second switching transistor, a second equivalent diode, a first capacitor, and a second capacitor. In addition, the input voltage is switched between zero and a first voltage; V2−G1−W1≤V1<V2−W1; W2<V3≤G2+W2; the first voltage is greater than the conduction voltage drop of the first equivalent diode, the first voltage is greater than the threshold voltage of the second switching transistor, and the first voltage is greater than the threshold voltage of the first switching transistor. When the input voltage is zero, the second switching transistor is in a sub-threshold state, but is still cut off. However, when the input voltage changes from zero to the first voltage, the second switching transistor changes from a sub-threshold state to a conducted state, so that an output voltage of the level conversion circuit is 0 V, and voltage converting from the first voltage of the input voltage to 0 V of the output voltage is implemented. In this way, when the input voltage is zero, 0<VQ2$_{gate}$−VQ2$_{second}$≤G2, and the second switching transistor is in a sub-threshold state. Therefore, when the input voltage changes from zero to the first voltage, as long as a voltage difference between a first end and a gate of the second switching transistor changes from a value between 0 V and G2 to a value greater than the threshold voltage G2 of the second switching transistor, the second switching transistor can be immediately conducted without changing from 0 V to a sub-threshold state as a transit state before changing to a fully conducted state, and a conversion speed of the level conversion circuit is finally improved. Further, it may be learned from a capacitor feature that when receiving a transient signal, the capacitor has a no-delay function, and therefore when a received signal changes from zero to the first voltage or changes from the first voltage to zero, both the first capacitor and the second capacitor in the present invention have a no-delay function, and a conversion speed of the level conversion circuit is further improved.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of hardware in addition to a software functional unit.

When the foregoing integrated unit is implemented in a form of a software functional unit, the integrated unit may be stored in a computer-readable storage medium. The software functional unit is stored in a storage medium and includes several instructions for instructing a computer device (which may be a personal computer, a server, or a network device) to perform some of the steps of the methods described in the embodiments of the present invention. The foregoing storage medium includes: any medium that can store program code, such as a USB flash drive, a removable hard disk, a read-only memory (Read-Only Memory, ROM for short), a random access memory (Random Access Memory, RAM for short), a magnetic disk, or an optical disc.

Finally, it should be noted that the foregoing embodiments are merely intended for describing the technical solutions of the present invention but not for limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present invention.

What is claimed is:
1. A level conversion circuit, comprising:
a first equivalent diode, a first switching transistor, a second switching transistor, a second equivalent diode, a first capacitor, and a second capacitor, wherein a cathode of the first equivalent diode is connected to a first reference voltage, and an anode of the first equivalent diode is separately connected to a gate of the first switching transistor and a first end of the first capacitor, a first end of the first switching transistor is connected to a second reference voltage, and both a second end of the first switching transistor and a first end of the second switching transistor are connected to an output voltage, both a second end of the first capacitor and a first end of the second capacitor are connected to an input voltage, a second end of the second capacitor is separately connected to a cathode of the second equivalent diode and a gate of the second switching transistor, and a second end of the second switching transistor is grounded, and an anode of the second equivalent diode is connected to a third reference voltage, and wherein the input voltage is switched between zero and a first voltage;

V2−G1−W1≤V1<V2−W1; and W2<V3≤G2+W2; wherein, V1, V2, and V3 are respectively the first reference voltage, the second reference voltage, and the third reference voltage, W1 is a conduction voltage drop of the first equivalent diode, G1 is a threshold voltage of the first switching transistor, G2 is a threshold voltage of the second switching transistor, and W2 is a conduction voltage drop of the second equivalent diode, and wherein the first voltage is greater than the conduction voltage drop of the first equivalent diode, the first voltage is greater than the threshold voltage of the second switching transistor, and the first voltage is greater than the threshold voltage of the first switching transistor;

when the input voltage is zero, the anode and the cathode of the first equivalent diode are cut off, and the anode and the cathode of the second equivalent diode are conducted; and when the input voltage changes from zero to the first voltage, the anode and the cathode of the first equivalent diode are conducted, an absolute value of a voltage difference between the gate and the first end of the first switching transistor is not greater than the threshold voltage of the first switching transistor, and the first end and the second end of the first switching transistor are cut off, a voltage difference between the anode and the cathode of the second equivalent diode is not greater than the conduction voltage drop of the second equivalent diode, and the anode and the cathode of the second equivalent diode are cut off, and an absolute value of a voltage difference between the gate and the second end of the second switching transistor is greater than the threshold voltage of the second switching transistor, and the first end and the second end of the second switching transistor are conducted, so that the output voltage is zero.

2. The circuit according to claim 1, wherein:

when the input voltage changes from the first voltage to zero, a voltage difference between the anode and the cathode of the first equivalent diode is not greater than the conduction voltage drop of the first equivalent diode, and the anode and the cathode of the first equivalent diode are cut off;

the absolute value of the voltage difference between the gate and the first end of the first switching transistor is greater than the threshold voltage of the first switching transistor, and the first end and the second end of the first switching transistor are conducted;

the voltage difference between the anode and the cathode of the second equivalent diode is equal to the conduction voltage drop of the second equivalent diode, and the second equivalent diode is in a pre-conducted state; and the absolute value of the voltage difference between the gate and the second end of the second switching transistor is not greater than the threshold voltage of the second switching transistor, and the first end and the second end of the second switching transistor are cut off, so that the output voltage is the second reference voltage.

3. The circuit according to claim 1, wherein V1=V2−G1−W1 and V3=G2+W2.

4. The circuit according to claim 1, comprising a phase inverter having an output end connected to the input voltage and configured to output the input voltage.

5. The circuit according to claim 1, wherein the first equivalent diode comprises a first P-type metal-oxide-semiconductor (PMOS) transistor, and wherein a gate and a drain of the first PMOS transistor are connected and used as the cathode of the first equivalent diode, and a source of the first PMOS transistor is used as the anode of the first equivalent diode.

6. The circuit according to claim 1, wherein the first switching transistor comprises a second PMOS transistor, and wherein a gate of the second PMOS transistor is used as the gate of the first switching transistor, a source of the second PMOS transistor is used as the first end of the first switching transistor, and a drain of the second PMOS transistor is used as the second end of the first switching transistor.

7. The circuit according to claim 1, wherein the second switching transistor comprises a first N-type metal-oxide-semiconductor (NMOS) transistor, and wherein a drain of the first NMOS transistor is used as the first end of the second switching transistor, a source of the first NMOS transistor is used as the second end of the second switching transistor, and a gate of the first NMOS transistor is used as the gate of the second switching transistor.

8. The circuit according to claim 1, wherein the second equivalent diode comprises a second NMOS transistor, and wherein a source of the second NMOS transistor is used as the cathode of the second equivalent diode, and a gate and a drain of the second NMOS transistor are connected and used as the anode of the second equivalent diode.

9. The circuit according to claim 6, wherein:

a result acquired by subtracting a capacitance of a parasitic capacitor of the gate of the second PMOS transistor from a capacitance of the first capacitor is less than a preset value; and a result acquired by subtracting a capacitance of a parasitic capacitor of the gate of the first NMOS transistor from a capacitance of the second capacitor is less than the preset value, and wherein the preset value is greater than zero.

10. An electronic device, comprising a level conversion circuit according to claim 1.

* * * * *